United States Patent
Burnsed et al.

(10) Patent No.: US 11,940,613 B2
(45) Date of Patent: Mar. 26, 2024

(54) LOCALIZED BRIGHTNESS CONTROL IN BI-DIRECTIONAL DISPLAY WITH DETECTOR

(71) Applicant: L3Harris Technologies, Inc., Melbourne, FL (US)

(72) Inventors: Jon D. Burnsed, Tempe, AZ (US); Jacob J. Becker, Gilbert, AZ (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 177 days.

(21) Appl. No.: 17/514,896

(22) Filed: Oct. 29, 2021

(65) Prior Publication Data
US 2023/0136687 A1 May 4, 2023

(51) Int. Cl.
*G02B 23/12* (2006.01)
*H10K 59/13* (2023.01)

(52) U.S. Cl.
CPC ............. *G02B 23/12* (2013.01); *H10K 59/13* (2023.02)

(58) Field of Classification Search
CPC .................................. G02B 23/12; H10K 9/13
USPC ................................ 359/400, 403, 419, 421
See application file for complete search history.

(56) References Cited

U.S. PATENT DOCUMENTS

| | | |
|---|---|---|
| 8,830,204 B2 | 9/2014 | Sultenfuss et al. |
| 9,097,891 B2 | 8/2015 | Border et al. |
| 2004/0196566 A1 | 10/2004 | Beystrum et al. |
| 2011/0248973 A1 | 10/2011 | Kuhlman et al. |
| 2013/0342473 A1* | 12/2013 | Sultenfuss ............ G06F 3/0393 345/173 |
| 2015/0371579 A1* | 12/2015 | Yu ........................ G09G 3/3208 345/690 |

(Continued)

FOREIGN PATENT DOCUMENTS

| | | | |
|---|---|---|---|
| EP | 2375399 A1 | 10/2011 | |
| EP | 2940680 A1 * | 11/2015 | ............... G09G 3/20 |

(Continued)

OTHER PUBLICATIONS

European Search Report received for EP Patent Application No. 22203113.0, dated Jun. 1, 2023, 14 pages.

(Continued)

*Primary Examiner* — William R Alexander
*Assistant Examiner* — Sharrief I Broome
(74) *Attorney, Agent, or Firm* — Workman Nydegger

(57) ABSTRACT

An apparatus and method are provided for a night vision system including a transparent overlay display that transmit direct-view light representing an intensified image and emits display light representing a display image. The overlay display includes photodetectors arranged to detect an intensity of the incoming direct-view light, and an intensity of the display light depends on the detected intensity. In some embodiments, the intensity of the display light is spatially modulated using an amplitude or envelope of the intensity that is based on the detected local intensity of the direct-view light. In some embodiments, the intensity of the display light is adjusted to correct for loss of the direct-view light. The intensity of the display light may be controlled using control circuitry that receives signals from the photodetectors, and the control circuitry may be located on the same semiconductor chip as the overlay display.

20 Claims, 11 Drawing Sheets

(56) References Cited

U.S. PATENT DOCUMENTS

| | | | |
|---|---|---|---|
| 2017/0047020 A1* | 2/2017 | Yata | G09G 3/3413 |
| 2020/0271583 A1* | 8/2020 | Ortiz Egea | G01J 3/12 |
| 2020/0400944 A1 | 12/2020 | Burnsed et al. | |

FOREIGN PATENT DOCUMENTS

| | | | |
|---|---|---|---|
| EP | 2940680 A1 | 11/2015 | |
| WO | 2004002143 | 12/2003 | |
| WO | 2007049213 | 5/2007 | |
| WO | WO-2018017177 A2 * | 1/2018 | G02B 23/12 |

OTHER PUBLICATIONS

U.S. Appl. No. 16/868,306, filed May 6, 2020.
European Search Report received for EP Patent Application No. 22203113.0, dated Feb. 28, 2023, 14 pages.

* cited by examiner

LOCALIZED BRIGHTNESS CONTROL IN BI-DIRECTIONAL DISPLAY WITH DETECTOR

BACKGROUND

Night vision (NV) systems allow users to see in low-light environments without flooding the environment with visible light. Accordingly, NV systems can be used for covert vision in low-light environments. By enabling sight without illumination in the visible or other spectra, NV systems protect users from being detected.

Analog NV systems function by receiving low levels of light and intensifying the received light using an image intensifier. The image intensifier has a photocathode that emits electrons in response to incident photons. The emitted electrons are accelerated through a vacuum tube and directed towards a microchannel plate that amplifies the signal by multiplying the number of electrons. The multiplied electrons then strike a phosphor screen, and, via the phenomenon of luminescence, the phosphor screen emits photons in response to radiant energy (e.g., the electrons). The luminescent light from the phosphor screen is coupled through a series of optics to the user. For example, the luminescent light may be coupled through an inverting fiber optic to an eyepiece where the user can view the illuminated phosphor screen, thus allowing the user to see the objects.

In analog NV systems, it is desirable to implement an overlay display in conjunction with the Intensified image. Such a display conveys to the user information, such as temperatures, distances, indicators marking objects, situational awareness messages, messages from other users, etc. The display light from an overlay display is superimposed on the direct-view, intensified light to generate a combined image (including the display image and the direct-view, intensified image).

A challenge with superimposing a display image over an intensified image is that the intensified image depends on the light from the environment, and the environmental light can (and likely will) vary both with respect to space and time. If the intensity amplitude (e.g., the intensity scale) of the display light is constant, then sometimes (and in some places) the display light will likely be much brighter than the intensified light, overwhelming the intensified light and making parts (or all) of intensified display image difficult for a user to see. Alternatively, sometimes (and in some places) the display light might be much dimmer than the intensified light, and the intensified light might overwhelm the display light, making parts (or all) of the display image difficult for a user to see. Accordingly, an improved analog NV systems is desired with the functionality to modulate the intensity amplitude of the display light based on the intensity of the intensified light, thereby to balance the relative intensities of the display light and the intensified light such that both the display image and the intensified image can be seen and neither image overwhelms the other.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes an optical device that includes a semiconductor chip having a first surface that receives direct-view light, which passes through transparent regions of the optical device. The optical device further includes a plurality of electro-optical circuits formed on the semiconductor chip. The plurality of electro-optical circuits includes light emitters and detectors. The light emitters are configured to output display light, and the transparent regions being arranged among the light emitters. Each of the detectors is associated with one or more of the light emitters, and the detectors are configured to detect respective signals representing an intensity of the direct-view light. An intensity of the display light output by the one or more light emitters depends on the signal detected by the associated detector.

In another embodiment the optical device further includes an intensifier, a photocathode, a multiplier, and a phosphor screen. The intensifier generates the direct-view light. The photocathode is configured to receive imaged light from an objective and emit electrons in response to the imaged light. The multiplier is configured to receive electrons emitted from the photocathode and to increase a number of the electrons, generating multiplied electrons. The phosphor screen receives the multiplied electrons and in response to incident emits the direct view light, the direct view light representing an intensified image.

A third embodiment illustrated herein is a method of balancing an intensity of display light relative to an intensity of direct-view light in an optical device. The method includes receiving direct-view light at a first surface of a semiconductor chip in an optical device. The semiconductor chip has transparent regions through which the direct-view light is transmitted. The semiconductor chip having a plurality of electro-optical circuits that include light emitters and detectors, and each detector is associated with one or more of the light emitters. The method uses detectors to detect respective signals representing an intensity of the direct-view light. The method further includes outputting display light from the light emitters. The intensity of the display light output by the one or more light emitters is determined using the signal detected by the associated detector. In certain embodiments, the method includes determining the display light output by the one or more light emitters by setting an amplitude of the intensity of the display light output by the one or more light emitters based on the signal detected by the associated detector.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1A:
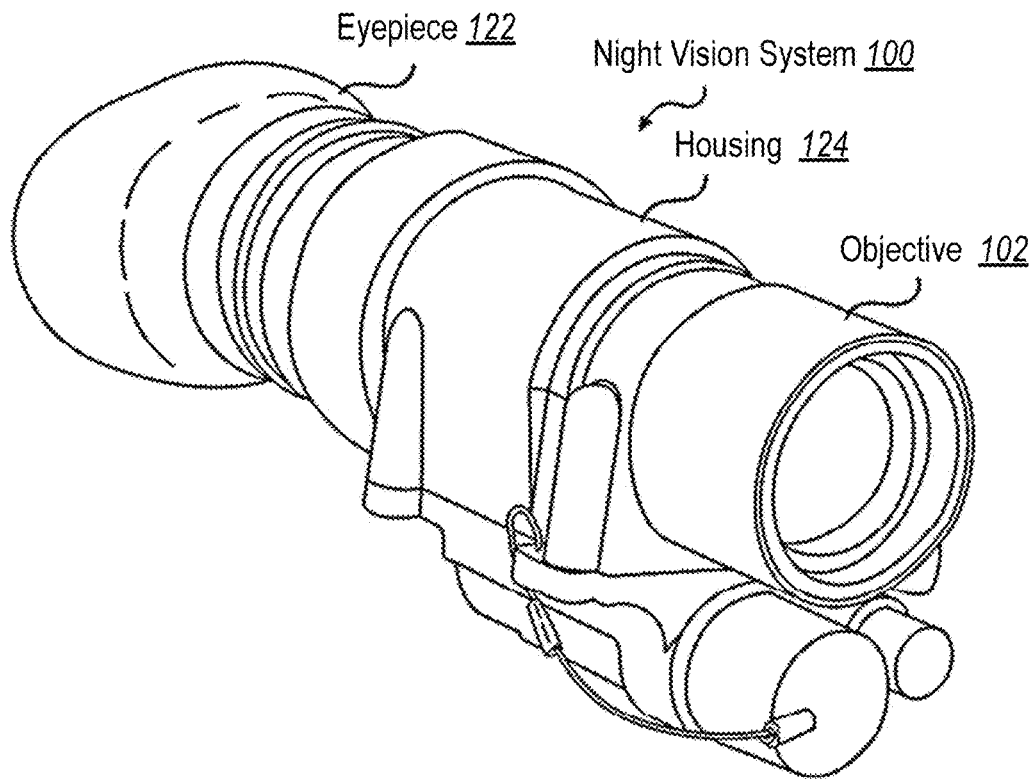
FIG. 1A illustrates a perspective view of a night vision (NV) system, according to one embodiment.

As discussed above, in analog night vision (NV) systems, it is desirable to superimpose a display image from an overlay display over an intensified, direct-view image. Such a display image conveys to the user information, such as temperatures, distances, indicators marking objects, situational awareness messages, messages from other users, etc. In addition to combining the intensified image with the display image into a single combined image, it is desirable to balance an intensity of the display light (i.e., the light from the overlay display) relative to the intensity of the intensified image. Otherwise, one of the two images might overwhelm the other, making the fainter of the two images difficult to see. For example, the intensity of the display light might be much greater than the intensified image, resulting in the intensified image being faint relative to the display light. Alternatively, if the display light is much fainter than the intensified image, then the intensified image might overwhelm the overlay display, making the overlay display difficult to see. Accordingly, in certain embodiments described herein, the analog NV systems provide the improved functionality of detecting an intensity of the intensified image and using the resultant signal(s) when determining representing the intensity of the display light generated by an overlay display.

In view of above, overlay displays (e.g., the above heads-up display) in direct-view, analog NV systems preferably balance the display-light levels against that of the underlying image/scene. In certain embodiments, the analog NV systems may sample the brightness of the underlying image/scene to create a global display adjustment, or the analog NV systems may average the brightness of the whole scene. If one area in the underlying image/scene is significantly brighter than another area in underlying image/scene, than properly setting the brightness of the overlay display can be challenging.

As discussed above, an analog NV system can include both an intensified image and a display image, such as the image from a heads-up display. Preferably, the relative intensities of these images will be balanced, such that one of the two images does not overwhelm the other image, rendering the other image difficult to see. This may be accomplished, e.g., by spatially modulating an intensity amplitude of the display light based on a detected intensity of the intensified light as a function of position along the overlay display. Because the localized average intensity of the intensified image may vary across the image, the maximum intensity of the display light may be smaller in regions where the intensified light is dim on average, and the maximum intensity of the display light may be greater in regions where the intensified light is bright on average.

For example, a spatial moving average of the local intensity of the intensified image can vary as a function of position. The spatial moving average for a given pixel may be calculated as a weighted average of detected signals from photodetectors that are within a predetermined number of pixels of the given pixel. Spatially varying the intensity of the display image based on the local intensity of the intensified image can be advantageous to balance the relative intensities of the two images, making the combined image more user friendly. For example, when the local intensities of the two images are balanced, a user can more readily discern the information and details in each of the respective images.

Accordingly, in certain embodiments described herein, photodetectors can be arranged on a backside (i.e., the non-emitting side) of pixels used to generate the display image. For example, the display image can be generated using an overlay display (example embodiments of the overlay display are described below). The overlay display may include transmission regions between the pixels of the overlay display. The intensified image, which is incident on the backside of the overlay display, is transmitted through the transmission regions. Display light is produced by the pixels of the overlay display to generate the display image, which is superimposed on the intensified image. The pixel regions of the overlay display would significantly attenuate those rays of the intensified light directed toward the pixel regions rather than passing through the transparent regions. Accordingly, photodetectors can be arranged on the backside of the pixels to intercept and detect those rays that would otherwise be attenuated by passing through the pixel regions. These photodetectors detect signals representing the intensified image. In certain embodiments, the detected signals are spatially averaged to determine the spatial variations in the average intensity of the intensified image.

In certain embodiments, the signals generated by the photodetectors can be used to modulate the intensity of the display image. For example, the photodetector signals can determine a spatially varying intensity envelope for the pixels of the overlay display, and the display light at respective locations can be scaled according to this intensity envelope. For example, the intensity envelope can be based on a moving average of the photodetector signals. In other embodiments, the intensity envelope can be based on a spatial low-pass filtering of the photodetector signals. The intensity envelope can be based on time averaging or filtering the photodetector signals. The intensity envelope can be an intensity amplitude that is used to spatially modulate the intensity of the display light.

In alternative/additional embodiments, the intensity of the display light is controlled based on the detected intensified light to augment and/or amplify the intensified light. For example, the display light may correct for attenuation of the intensified light as it passes through the overlay display and/or passes through the underlying, direct-view imaging system (e.g., the analog NV system). The display light may have a same spectrum as the intensified light when used to augment and/or amplify the intensified light, and the display light may have a different spectrum than the intensified light when used as a heads-up display, for example.

In one embodiment, the analog NV system implements overlay display functionality using a transparent overlay display, which in some embodiments may be an organic light emitting diode (OLED) display. The OLED display may be at least partially transparent to transmit the Intensified image generated by an image intensifier. Here, the phrase "partially transparent" means that the given component transmits 20% or more of the light incident on the component. Unless explicitly specified otherwise, the word "transparent" as used herein means partially transparent because, in practice, optical components are not 100% transparent due to Fresnel reflection, absorption, and scattering, for example. Additionally, the word "transmit" as used herein means that some (but not all) of the incident light passes through the given component.

Transparent regions may be arranged between/among the pixels of the overlay display to transmit the intensified light and thereby transmit the Intensified image through the overlay display. The photodetector may be positioned to intercept the rays of intensified light that are directed toward or lie along the optical pathway towards the pixels. Alternatively or additionally, the photodetectors may detect light outside of the visible spectrum, and may be positioned to intercept the rays of intensified light that pass through the transparent regions of the overlay display. The photodetectors may be located upstream from the transparent overlay display, or photodetectors may be collocated with and integrated on the overlay display.

Figure 1B:
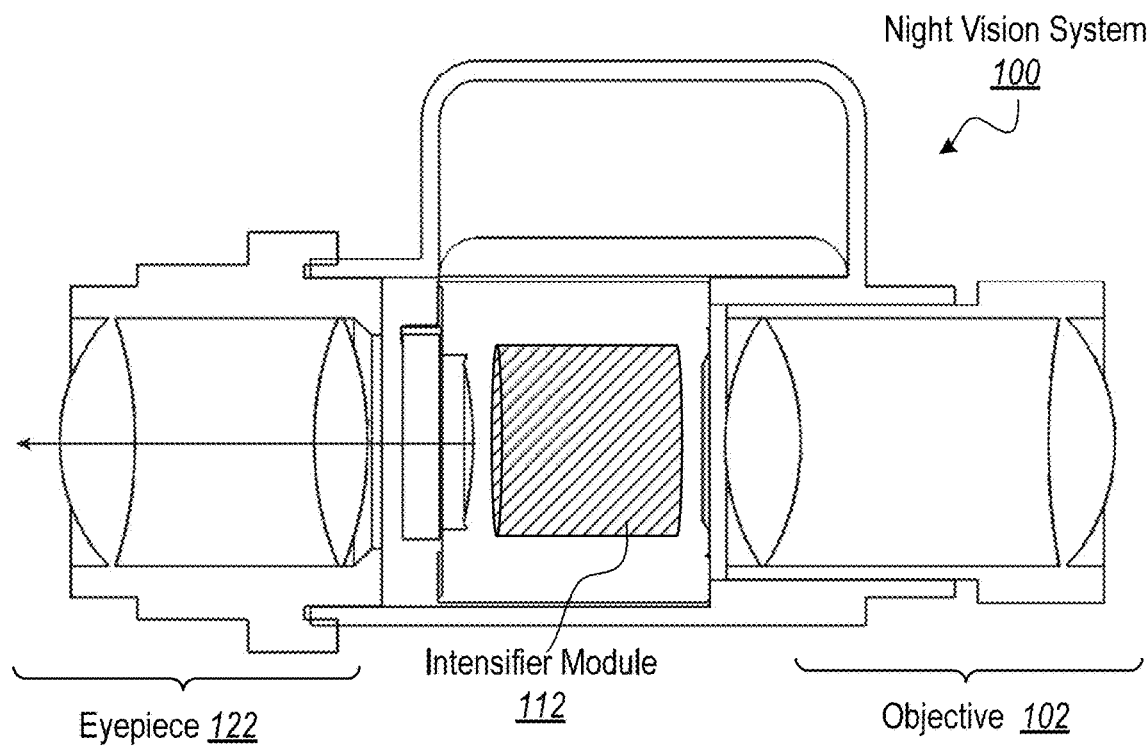
FIG. 1B illustrates a side cutaway view of the NV system, according to one embodiment.

Referring now to FIGS. 1A and 1B, a non-limiting example of a NV system is illustrated. In particular, FIGS. 1A and 1B illustrate a PVS–14 NV system 100. In the example illustrated, the NV system 100 includes a housing 124. As will be illustrated in more detail below in other figures, the housing 124 houses an image intensifier module 112. The NV system 100 further includes an objective 102 which receives dim light from the environment, for example. The objective 102 includes optics such as lenses, waveguides, and/or other optical components for receiving and transmitting light to the image intensifier module 112. The NV system 100 further includes an eyepiece 122. The eyepiece 122 includes optics for focusing images created by the NV system 100 into the eye of the user.

Figure 2:
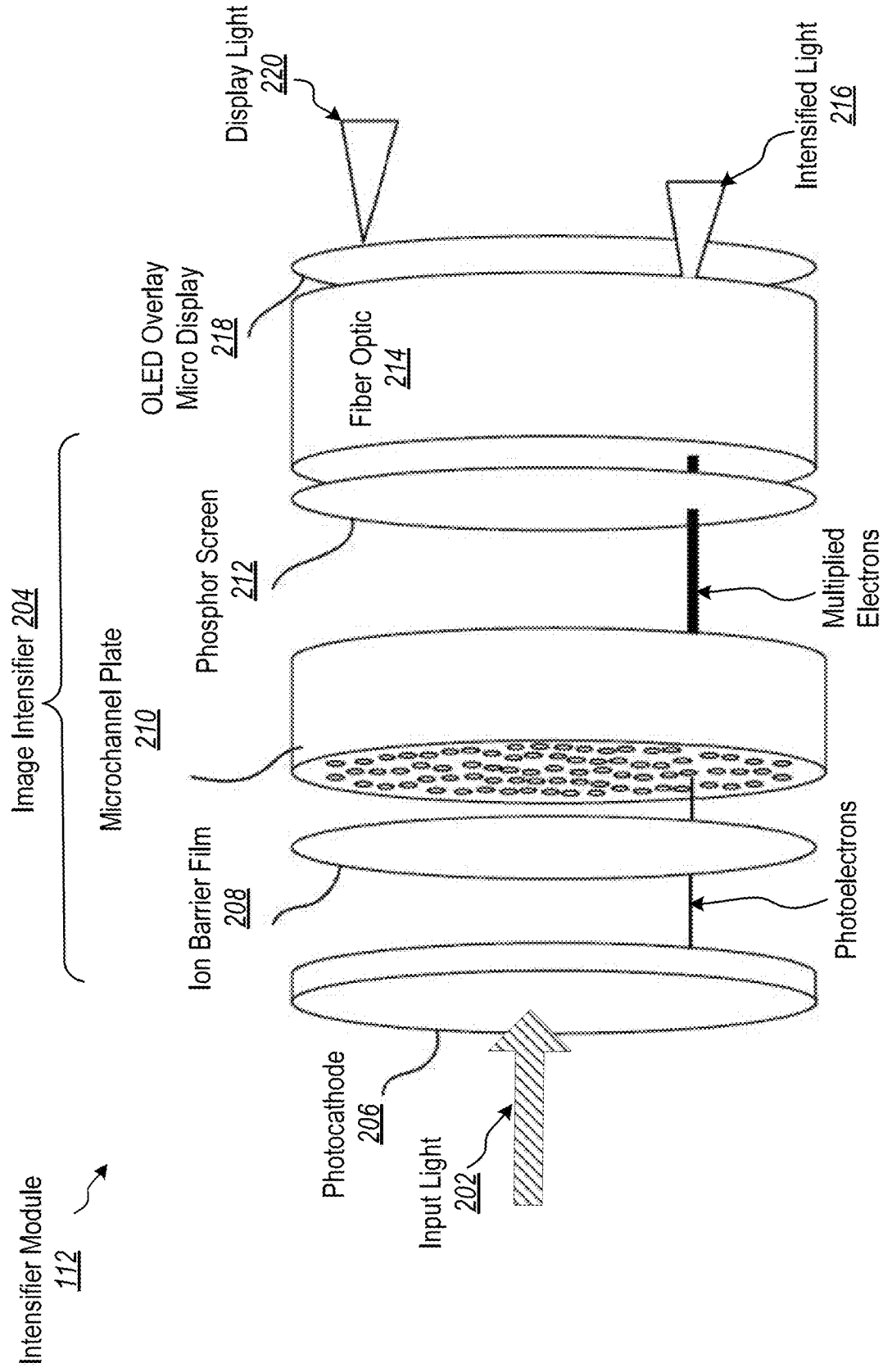
FIG. 2 illustrates a schematic diagram of an intensifier module of the NV system, according to one embodiment.

FIG. 2 illustrates the image intensifier module 112, according to one example. The image intensifier module 112 includes an image intensifier 204, an overlay display 218, and various other components. The light from the image intensifier module 112 is captured by the eyepiece 122 and directed to the user. Thus, the image provided to the user is a combined image that includes both the intensified image provided by the image intensifier 204 (i.e., the image corresponding to the intensified light 216) and the display image provided by the overlay display 218 (i.e., the image corresponding to the display light 220).

The image intensifier module 112 receives the input light 202, which has been transmitted through the objective 102 to the image intensifier module 112. The input light 202 may be, for example, dim light from a nighttime environment that would be challenging if not impossible to see unaided with the naked eye.

The objective directs the input light 202 into the image intensifier 204, as shown in FIG. 2. The image intensifier 204 may include functionality for amplifying the received image so that the image that can be viewed by the user. In the illustrated embodiment, this amplification is accomplished using a photocathode 206, a microchannel plate 210, and a phosphor screen 212. The photocathode 206 absorbs incident photons and outputs electrons in response. The electrons may pass through an optional ion barrier film 208. Electrons from the photocathode 206 are transmitted to the microchannel plate 210, which multiplies the number of electrons. The multiplied electrons then strike a phosphor screen 212, which absorbs the energy from electrons generating photons in response. The phosphor screen 212 converts the radiant energy of the multiplied electrons to luminescent light via the phenomenon of luminescence. Accordingly, the phosphor screen 212 glows due to electrons from the microchannel plate 210 striking the phosphor screen 212, creating an intensified image that represents the image of the input light 202.

Figure 3:
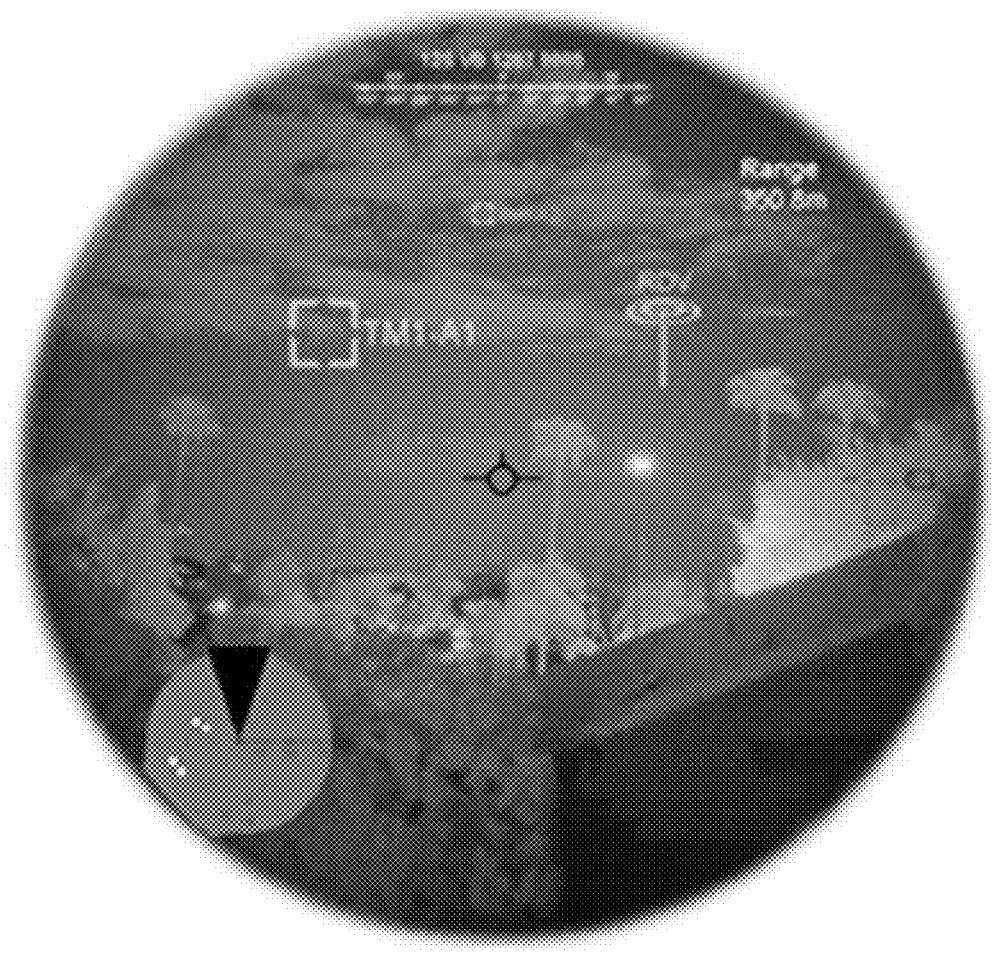
FIG. 3 illustrates an overlay display displayed on an Intensified image, according to one embodiment.

Returning to FIG. 2, a fiber-optic element 214 carries the intensified light 216 (with the intensified image) to the eyepiece 122 of the NV system where it is output to the user. Before the eyepiece 122, the intensified light 216 is transmitted through an overlay display 218. The overlay display 218 generates display light 220, which is superimposed with the intensified light 216. For example, the overlay display 218 may include functionality for displaying information to a user. Such information may include graphical content, including text, images, superimposed thermal image data and the like. FIG. 3 illustrates an example of an image in which an overlay display 218 superimposes text, symbols, and other information over an intensified image that includes trees and clouds. Additional details regarding certain embodiments of the NV system 100 and the overlay display 218 are provided in U.S. patent application Ser. No. 16/868, 306, filed on May 6, 2020, titled "Backside Etch Process for Transparent Silicon Oxide Technology", which is incorporated herein by reference in its entirety.

The display light 220 can have a different spectrum than the intensified light 216. For example, the intensified light 216 may be luminescent light generated by a phosphor when energized via radiant energy (e.g., the multiplied electrons in FIG. 2). In this case, the intensified light 216 has a spectrum determined by the phosphor. For example, the spectrum of the photons emitted and the perceived color generated by the phosphor screen 212 depends on the chemical composition of the phosphor. For example, the phosphor P14 (ZnS:Ag on ZnS:CdS:Cu) is perceived to have a blue color with orange persistence. Additionally, the phosphors P15 (ZnO:Zn), P16 (CaMgSi$_2$O$_6$:Ce), and P17 (ZnO, ZnCdS:Cu) are respectively perceived to be blue with a green persistence, bluish-purple with a bluish-purple persistence, and blue with a yellow persistence. In contrast to the intensified light 216, the spectrum of the display light 220 may appear to have an amber color, for example. In certain embodiments, the intensified light 216 and the display light 220 may be contrasting colors. In other embodiments, the intensified light 216 and the display light 220 may appear to be the same or similar colors.

Figure 4A:
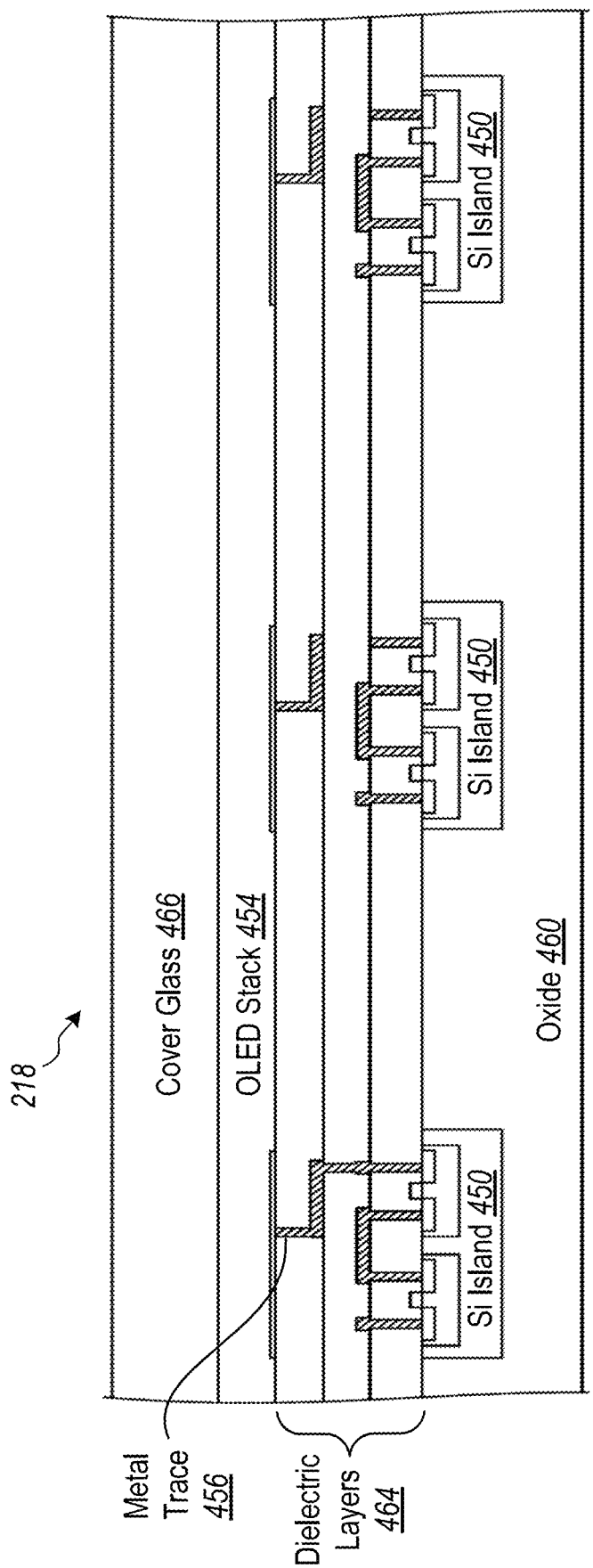
FIG. 4A illustrates a diagram of a portion of an overlay display, according to one embodiment.
Figure 4B:
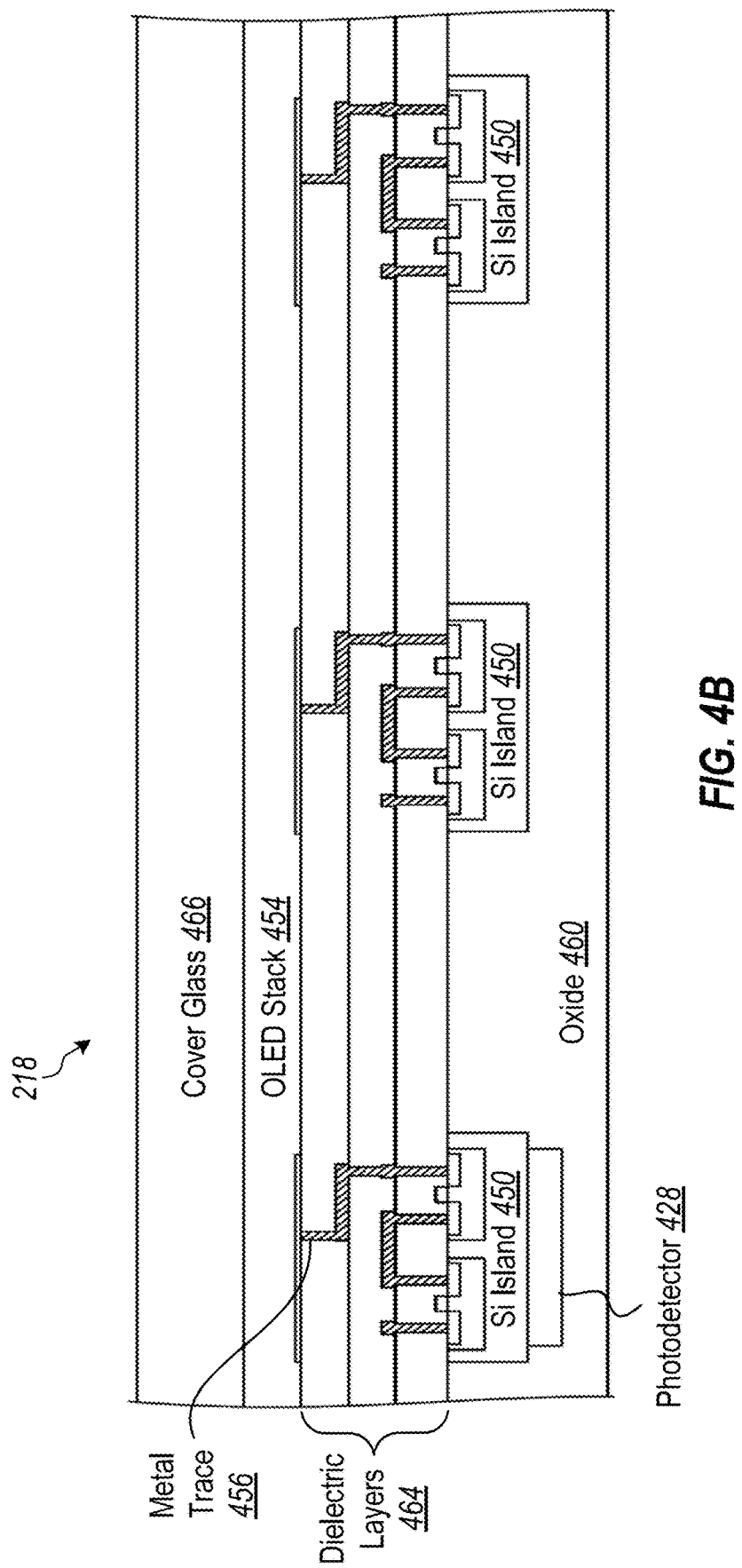
FIG. 4B illustrates a diagram of a portion of an overlay display with a photodetector, according to one embodiment.

FIGS. 4A and 4B illustrate example embodiments of the overlay display 218. For example, the overlay display 218 may include several active silicon (Si) islands 450 that provide control circuitry for controlling respective pixels of the overlay display 218. In certain embodiments, the overlay display 218 may be a digital display having a certain pixel density. Each pixel has one or more transistors controlling one or more organic light emitting diodes (OLEDs). Additional details regarding the overlay display 218 are provided in U.S. patent application Ser. No. 16/868,306. FIG. 4A illustrates the overlay display 218 in a non-limiting embodiment without the photodetector being integrated. FIG. 4B illustrates the overlay display 218 for illustrative, non-limiting embodiments with an integrated photodetector 428.

In FIG. 4A, the photodetector 428 is not integrated with the overlay display 218. The photodetector 428 may be a separate component located between a fiber-optic element 214 and the overlay display 218. Alternatively, in certain embodiments, the photodetector 428 may be located between the phosphor screen 212 and the fiber-optic element 214. In certain embodiments, the intensifier module 112 does not include the fiber-optic element 214, which is optional. Accordingly, in certain embodiments, the photodetector 428 may be located between the phosphor screen 212 and the overlay display 218.

Referring now to FIG. 4A, in certain non-limiting embodiments, the overlay display 218 may include active silicon areas, which are illustrated as active Si islands 450 (e.g., native silicon islands). The active silicon islands 450 can be used to fabricate transistors, such as MOSFETs by doping the silicon (Si) with spatially varying concentrations donor and acceptor atoms. Further, the MOSFETs may be fabricated using intermetal and dielectric layers 464 that include insulators (e.g., oxides and dielectrics) and metal traces 456. In certain embodiments, the MOSFETs may provide (but are not limited to providing) logic functions and/or control functions (e.g., to control turning on/off the LEDs in the OLED stack 454).

In the example illustrated in FIG. 4A, each of the active silicon islands represents a pixel of the overlay display 218. Thus, by powering various LEDs in the OLED stack 454 using the transistors in the active silicon islands, a display image can be created by the overlay display 218, and the display image is output to a user. For example, a display image may be created by outputting the display light 220, as illustrated in FIG. 2. In FIG. 4A, the intensified light 216 enters the overlay display 218 from the bottom, passes through the oxide 460 and then through the other layers before exiting the overlay display 218 through the cover glass 466. The display light 220 is generated in the OLED and, like the intensified light 216 exits through the cover glass 466. After exiting through the cover glass, both the display light 220 and the intensified light 216 are transmitted to the eyepiece 122 of the NV system 100, and then to the user.

Whereas the pixels (i.e., active Si island 450, metal traces 456, and OLEDs in the OLED stack 454) substantially attenuate the intensified light 216, transparent regions between the pixels are at least partially transparent to the intensified light 216. Accordingly, the intensified light 216 is transmitted through the transparent regions between the pixels of the overlay display 218. In contrast, the active Si islands 450 and the metal traces 456 substantially block the intensified light 216.

In certain embodiments, a backside etch process removes the silicon in regions between the pixels of the overlay display 218 to improve transmission efficiency through the transparent regions between the pixels. Then a transparent backfill material may be used to backfill the regions in which the silicon was removed via the etch.

In other non-limiting embodiments (not illustrated), the regions between the pixels of the overlay display 218 are made to be partial transmitting by fabricating oxide trenches in the silicon layer (e.g., by fabricating oxide trenches in non-active SI islands), as discussed in U.S. patent application Ser. No. 16/868,306. The oxide trenches attenuate the intensified light 216 much less than the native silicon, thereby enabling the intensified light 216 to be partially transmitted in the regions between the pixels of the overlay display 218. The degree of transmission may be varied by varying the relative percentage of the transparent regions that are silicon versus silicon oxide, for example.

A person of ordinary skill would understand that transmission of the intensified light 216 may be achieved using one (or more) of the following techniques: backside etch, fabricating oxide trenches, or another technique that improves the transmission of light through the regions between the pixels of the overlay display 218.

FIG. 4B illustrates an embodiment in which a photodetector 428 is fabricated to detect the rays of light that are incident on the pixels of the overlay display. For example, the photodetector 428 may be a photodiode that has been fabricated using silicon or some other semiconductor. The photodetector 428 may be any transducer that generates a signal in response to light (e.g., a pyroelectric sensor, a superconducting nanowire photo detector, etc.).

FIG. 4B illustrates an embodiment in which some pixels have a photodetector 428 and other pixels of the overlay display 218 do not have a photodetector 428. For example, the photodetectors 428 can be arranged periodically, such that every third pixel has a respective photodetector 428. Alternatively, the photodetectors 428 can be arranged such that every second pixel has a photodetector 428, or the photodetectors 428 can be arranged such that every pixel has a photodetector 428. The photodetectors 428 can be distributed evenly throughout the overlay display 218.

Alternatively, the photodetectors 428 can be arranged to have a higher density in some zones and lower density in other zones, as discussed below with reference to FIG. 5. For example, regions corresponding to greater visual acuity or greater visual significance (e.g., regions where variations in intensity have a greater visual impact). For example, the foveal region of the eye has greater visual acuity than regions corresponding to peripheral vision. Accordingly, zones of the overlay display 218 corresponding to foveal vision can have a different density of photodetectors and/or a different width for spatial averaging than do zones of the overlay display 218 corresponding to peripheral vision, for example. Additional discussion of zones and their correspondence with eye anatomy are discussed below with reference to FIG. 5.

As discussed above, in the embodiment of the photodetector 428 illustrated in FIG. 4B, the photodetector 428 is illustrated as being integrated with an overlay display 218, but a person of ordinary skill would recognize that the photodetector 428 may be fabricated on a separate chip from the overlay display 218. For example, a flip chip process may be used to align and connect the overlay display 218 with the photodetector 428. Additionally, the photodetector 428 may be fabricated using the methods and techniques discussed in US Pat. Appl. No. ####titled "Semi-Transparent Detector Array For UV/Near-UV Detection", which is incorporated herein by reference in its entirety.

Figure 4C:
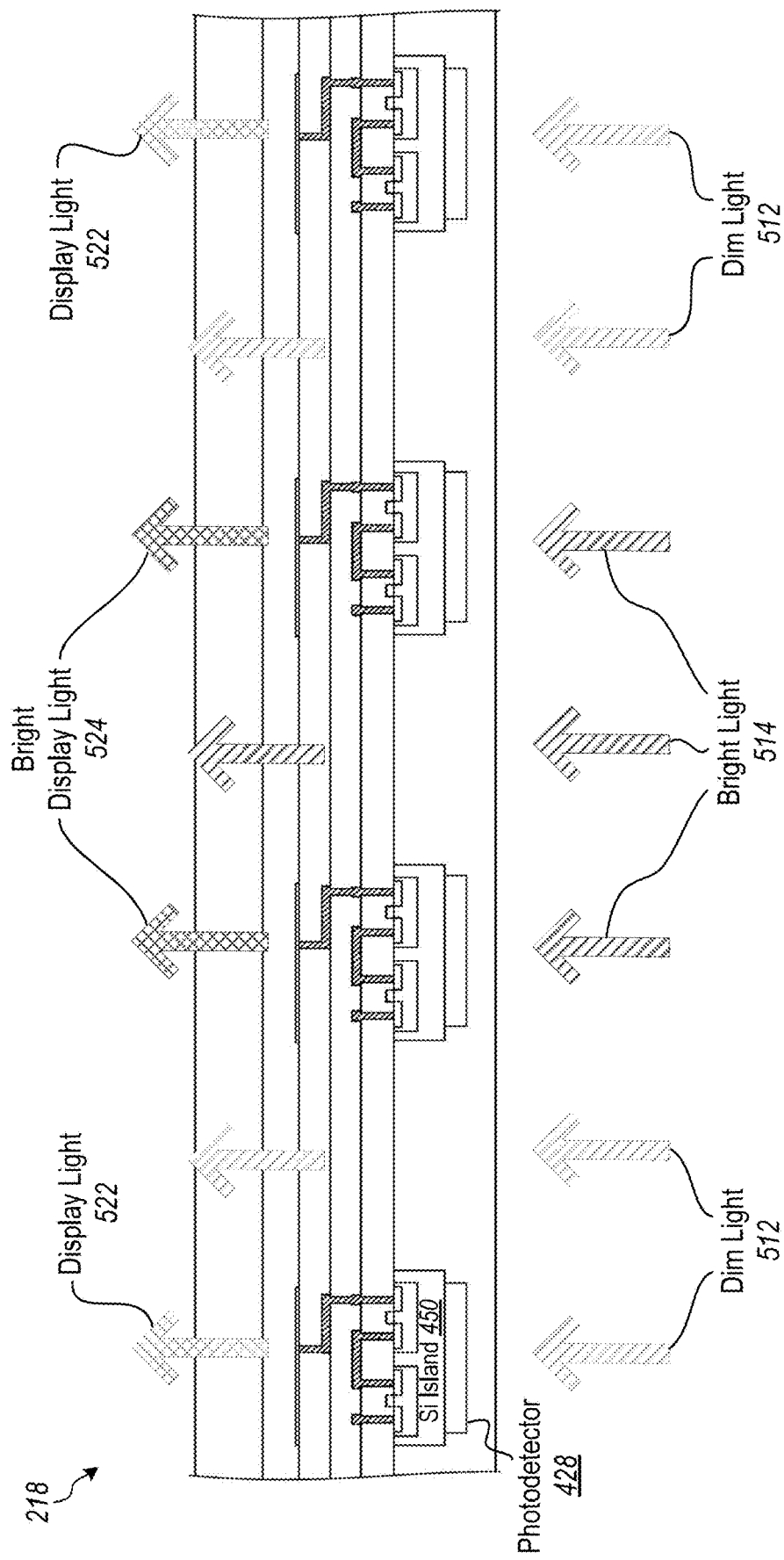
FIG. 4C illustrates a diagram of a portion of an overlay display with intensified light transmitted through the transparent regions and display light emitted from respective emitters, according to one embodiment.

FIG. 4C illustrates an example of a portion of an overlay display 218 where each pixel has a photodetector 428. The intensity of the incident light (e.g., the intensified light 216) varies as a function of position. More particularly, for the incident light in FIG. 4C, the dim light 512 is less intense than the bright light 514. The rays of the incident light in the transparent regions pass through the overlay display 218, and the rays of the incident light at the pixel of the overlay display 218 are detected by the photodetectors 428. When the photodetector 428 corresponding to a given pixel detects dim light 512, control logic decreases the intensity of the display light 522 to also be dim, like the detected dim light 512. That is, the display light 220 is spatially modulated based on the local intensity of the intensified light 216 detected by the respective photodetectors 428. When the photodetector 428 corresponding to a given pixel detects brighter light 514 (as compared to a dimmer detected light), control logic increases the intensity of the display light 524 to also be brighter (as compared to display light that would be displayed for dimmer detected light), like the detected bright light 514. Thus, the intensity of the display light depends on the detected intensity of the incident light.

FIG. 4C illustrates an example in which the relative brightness of the display light 522 and 524 depends on the locally detected intensity of the incident light. For example, the brightness control for the display light can vary from pixel to pixel. Additionally, the brightness control can depend on a moving spatial average of multiple pixels. Further, the signal from the photodetectors 428 can be integrated over time to decrease noise and fluctuations in the signal used to control the relative intensity of the display light 522 and 524. When the incident light comes from a phosphor, the phosphor will exhibit persistence in which the phosphor continues to generate light for a period after being excited by incident radiant energy (e.g., the radiant energy can be the multiplied electrons illustrated in FIG. 2). Thus, the temporal integration period over which the signal from the photodetectors 428 is integrated may be related to a time constant of persistence of the phosphor.

In certain embodiments, a readout communicates the information/signal from the photodetectors 428 to external controller logic. The external controller logic may then determine the relative intensity of the pixels of the overlay display 218, and the external controller logic communicates the relative intensities to the pixels of the overlay display 218.

Figure 4D:
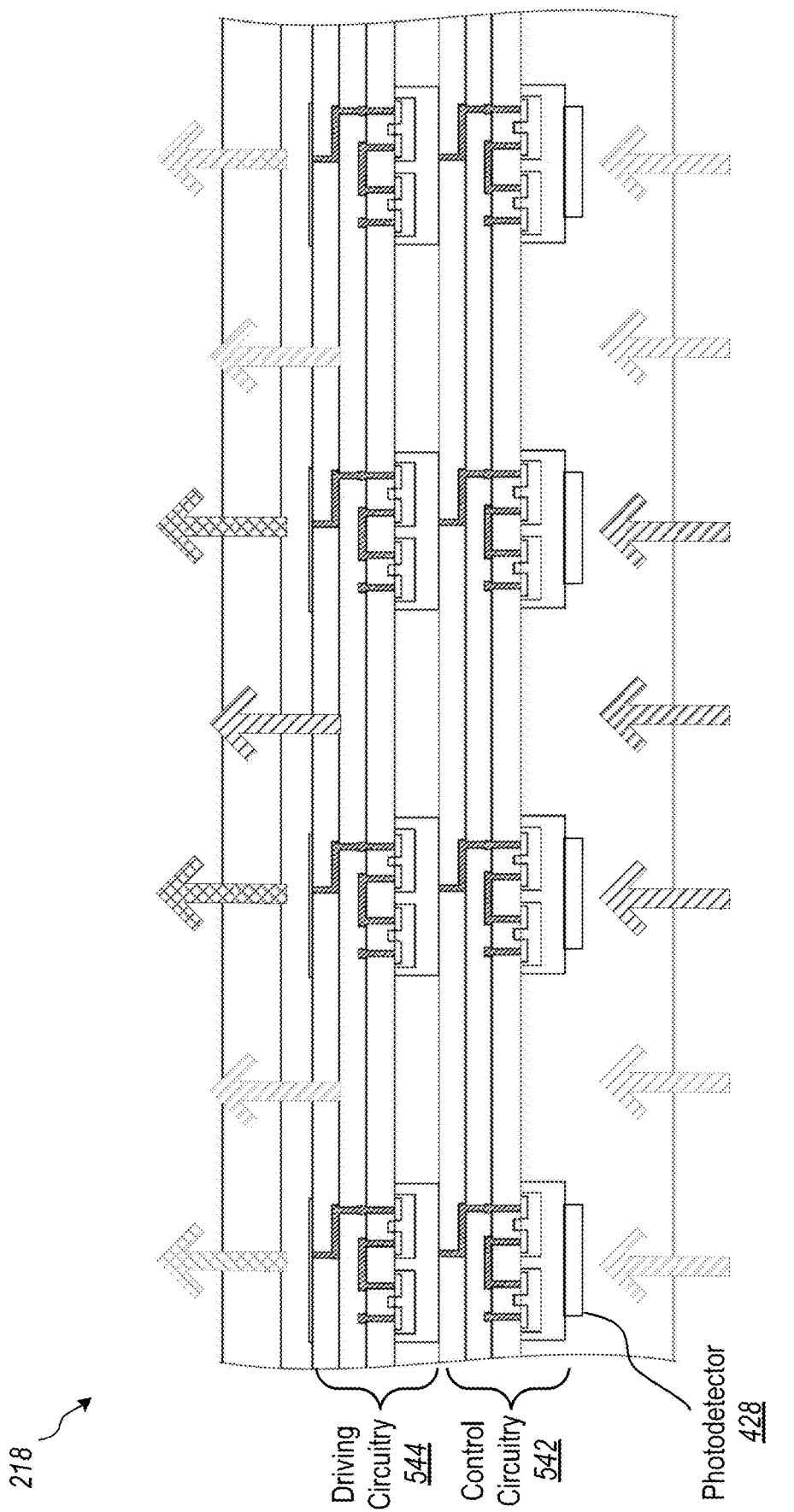
FIG. 4D illustrates a diagram of a portion of an overlay display with driving circuitry and control circuitry, according to one embodiment.

In other embodiments, the control logic determining the relative intensity of the display light 522 and 524 may be integrated with the circuitry of the pixels. FIG. 4D illustrates control circuitry 542 provided in semiconductor layers below the semiconductor layers in which the driving circuitry 544 is provided. The control circuitry 542 process the signals from the photodetector(s) 428 (e.g., by performing spatial averaging). This has the advantage that the signal from the photodetectors 428 are processed locally and do not require a high-speed readout of the detector pixels and external controller logic, which may require significant power.

In other embodiments, the control circuitry 542 may be replaced with readout circuitry that communicates the signals from the photodetectors 428 to external controller logic. In certain embodiments, the semiconductor layers in FIG. 4D for the control circuitry 542 can include both readout circuitry and control circuitry.

Figure 5:
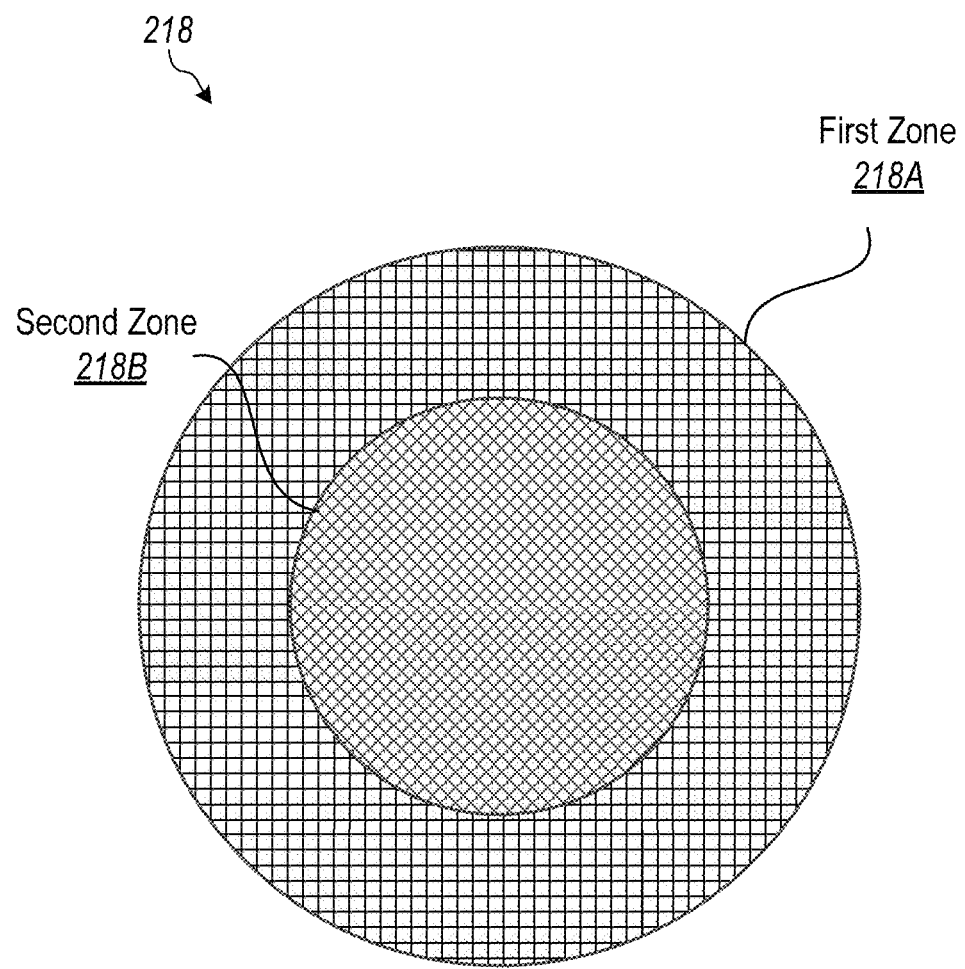
FIG. 5 illustrates a diagram of a portion of an overlay display with signals from photodetectors being used to determine the intensities of display light, according to one embodiment.

FIG. 5 illustrates an overlay display 218 having a first zone 218A and a second zone 218B. By having multiple disparate zones, embodiments can have several advantageous effects. For example, if a certain field of view (FOV) has a certain requirement (in that zone), embodiments can be tailored for best performance. Some embodiments may be based on ocular physiology. For example, a central zone for foveal vision can be implemented with higher light transmission through that zone and the display light can be brighter (e.g., to balance the greater intensity of the transmitted, direct-view light), as compared to edge zones for peripheral vision, since the central zone is foveal for the user. The edge zones that are less critical can be implemented having lower light transmission as compared to the central zone. Alternatively or additionally, a central zone can have high frame rate while edge zones implement a lower frame rate. A central zone could have more color options than an edge zone. Accordingly, the formula or look-up-table used to adjust the intensity of the display light 220 based on the locally detected intensity of the intensity of the intensified light 216 may be different between respective zones of the overlay display 218 to account for differences in frame rate, color, transmission rate, etc.

Figure 6:
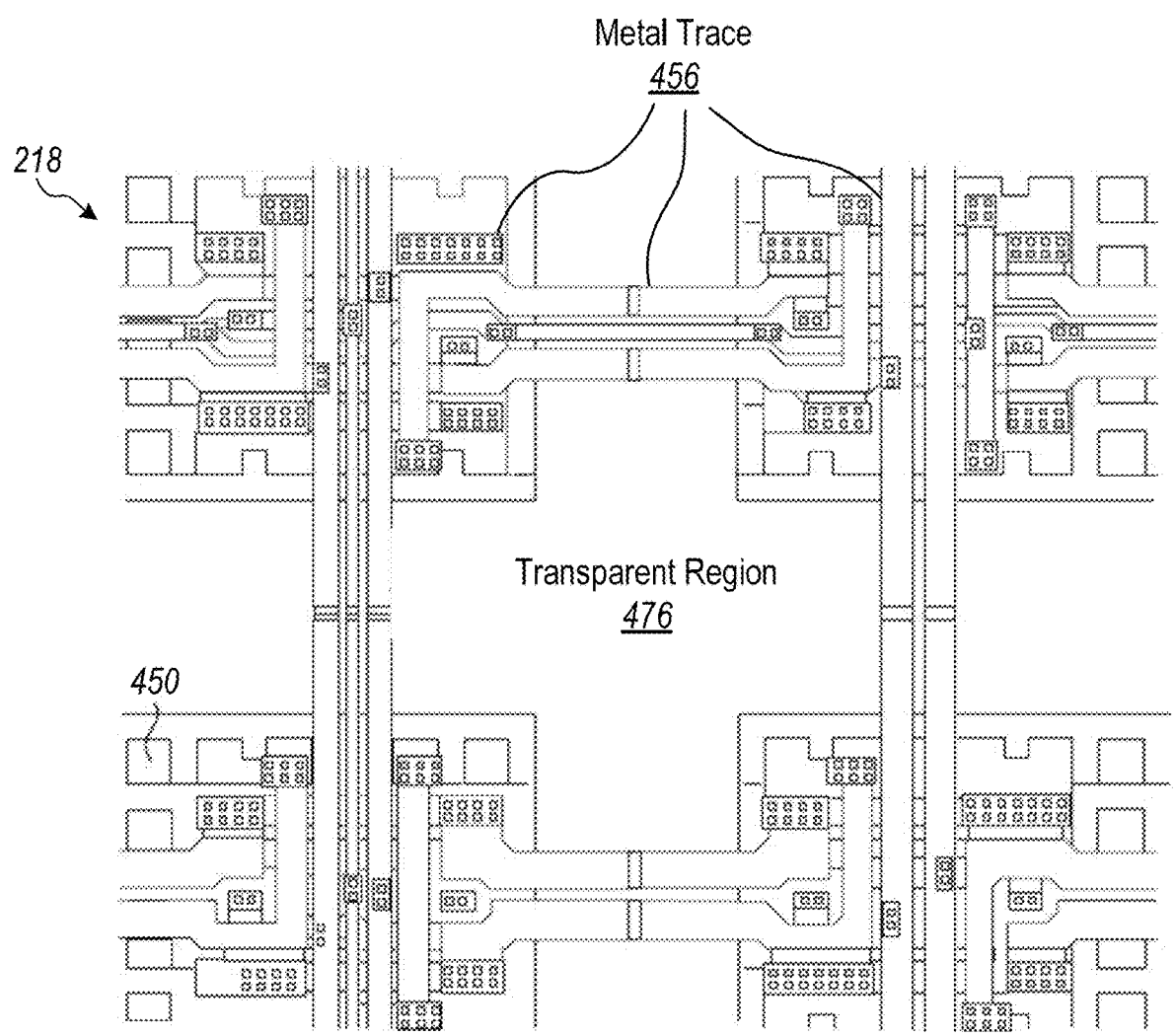
FIG. 6 illustrates a top-down view diagram of a portion of the overlay display, according to one embodiment.

FIG. 6 illustrates a top-down view of a portion of an overlay display 218 in which the opaque regions (e.g., regions including the active Si islands 450 and metal traces 456) are configured with transparent region 476 between the opaque regions. The active Si islands 450 and metal traces 456 may be configured as electronic components (such as MOSFETs) to provide logic functions and to provide control functions for the control of pixels in an overlay display 218. Additionally, the circuitry of the controller logic (i.e., the circuitry determining the relative intensities of the pixels) may also be located in the opaque regions. The active SI islands 450 and metal traces 456 substantially block the intensified light 216, but the intensified light 216 may be transmitted through the transparent region 476 between the Si islands 450 and metal traces 456.

In certain embodiments, the controller logic may be configured to determine the relative intensities based on a spatial moving average of the signal from the photodetectors 428 within a predetermined region. In certain embodiments, a user can select the size of the predetermined region for the spatial moving average. The spatial moving average for a given pixel may be calculated as a weighted average of detected signals from photodetectors that are part of a predetermined number of neighboring pixels for the given pixel (e.g., neighboring pixels may be pixels within predetermined region). For example, the size of the predetermined region may be 4 pixels by 4 pixels, or may be 10 pixels by 10 pixels. The size of the predetermined region may be the entire field of view. The size of the predetermined region may be M pixels by N pixels, where M and N are not equal. The spatial moving average may be a spatial low pass filter using a predefined window function. For example, the predefined window function may be one of: a square window, a Hann window, a Hamming window, a Gaussian window, a Blackman window, a Nuttall window, a Blackman-Harris window, a Tukey window, a Kaiser window a Dolph-Chebysehv window, or any other window that would be used for spatial filtering. The spatial filtering may be applied as a convolution in the spatial domain, or may be applied as a multiplication in the spatial-frequency domain, for example.

In certain embodiments, when the overlay display is not being used to display additional information (e.g., not being used as a heads-up display, which is superimposed on the pass-through/direct-view intensified image), the pixels of the overlay display may be used to duplicate/reinforce the intensified image. For example, the overlay display may be programmed to generate display light that is directly proportional to the detected signal from the photodetectors 428. In this way, the pixels of the overlay display 218 may compensate for a weak or attenuated intensified image passing through the overlay display 218.

In each of the embodiments, the photodetectors 428 detect signals representing an intensity of the intensified light 216 including some signals corresponding to dim light 512 and bright light 514. While dim light 512 and bright light 514 are shown, it should be appreciated that various intensities of light can be detected. Thus, the detected signals represent the intensified image. The detected signals may be used in various ways.

For example, the detected signals may be used to augment the intensified image by amplifying the intensified image. Alternatively or additionally, the detected signals may be used to augment the intensified image by correcting for spatial variations in the transmission efficiency of the intensified light 216 through the intensifier and/or the overlay display 218. The transmission efficiency may be calibrated, e.g., by illuminating the fiber-optic element 214 using a flood lamp and then measuring spatial variations in the transmission efficiency. Then the display light may reproduce the intensified image detected by the photodetectors 428 except the display light may compensate for regions with lower transmission efficiency for the intensified light 216 by emitting higher intensities for the display light 220 in those regions with lower transmission efficiencies as compared to lower emitted intensities in regions with higher transmission efficiencies. The light spectrum of the intensified light 216 may be the same as the light spectrum of the display light 220. Thus, whereas the intensified light 216 by itself may have spatial variations in transmission efficiency, the combination of the intensified light 216 with the display light 220 corrects for these spatial variations in transmission efficiency by emitting display light 220 that reproduces the intensified image where the emitted light reproducing the intensified image is more intense in regions of lower transmission efficiency. In this case, the emitted display light 220 represents the intensified image rather than a separate and distinct display image such as a heads-up display. In certain implementations, the emitted display light 220 representing the intensified image may be used to amplify the intensified image rather than to compensate for variation in the transmission efficiency of the intensified light 216. For example, the display light 220 may provide a spatially uniform reproduction of the detected image from the intensified light 216.

In other embodiments, the display light 220 may represent a separate and distinct display image such as a heads-up display. For example, the display light 220 may have a distinct spectrum from the intensified light 216. The display light 220 may have an amber color and the intensified light 216 may have a blueish-green color, for example. The display light 220 may represent text or other symbolic information, as illustrated in FIG. 3.

In certain embodiments, the detected signals from the photodetectors 428 may be used to determine an amplitude of the intensities for the display light 220. The amplitude of the intensity may be a maximum intensity, and the display light is modulated or scaled according to this maximum intensity. For example, the intensity of the display light without scaling may have a range from a minimum value of 0 to a maximum value of 255, and intensity value for a given pixel is 0≤β≤255 before scaling. Then, the detected signals from the photodetectors 428 is used to determine that the maximum intensity value is scaled down from 255 to a value α, which is less than 255. Accordingly, the intensity value of the given pixel may be scaled down from β to β*α/255, for example. In this example, the scaling is linear, but another scaling may be used (e.g., a nonlinear scaling). For example, light is perceived on a logarithmic scale, and a logarithmic scaling may be used. Accordingly, the logarithm of the intensity may be scaled, or some other scaling base on the detected signals from the photodetectors 428 may be used.

Figure 7:
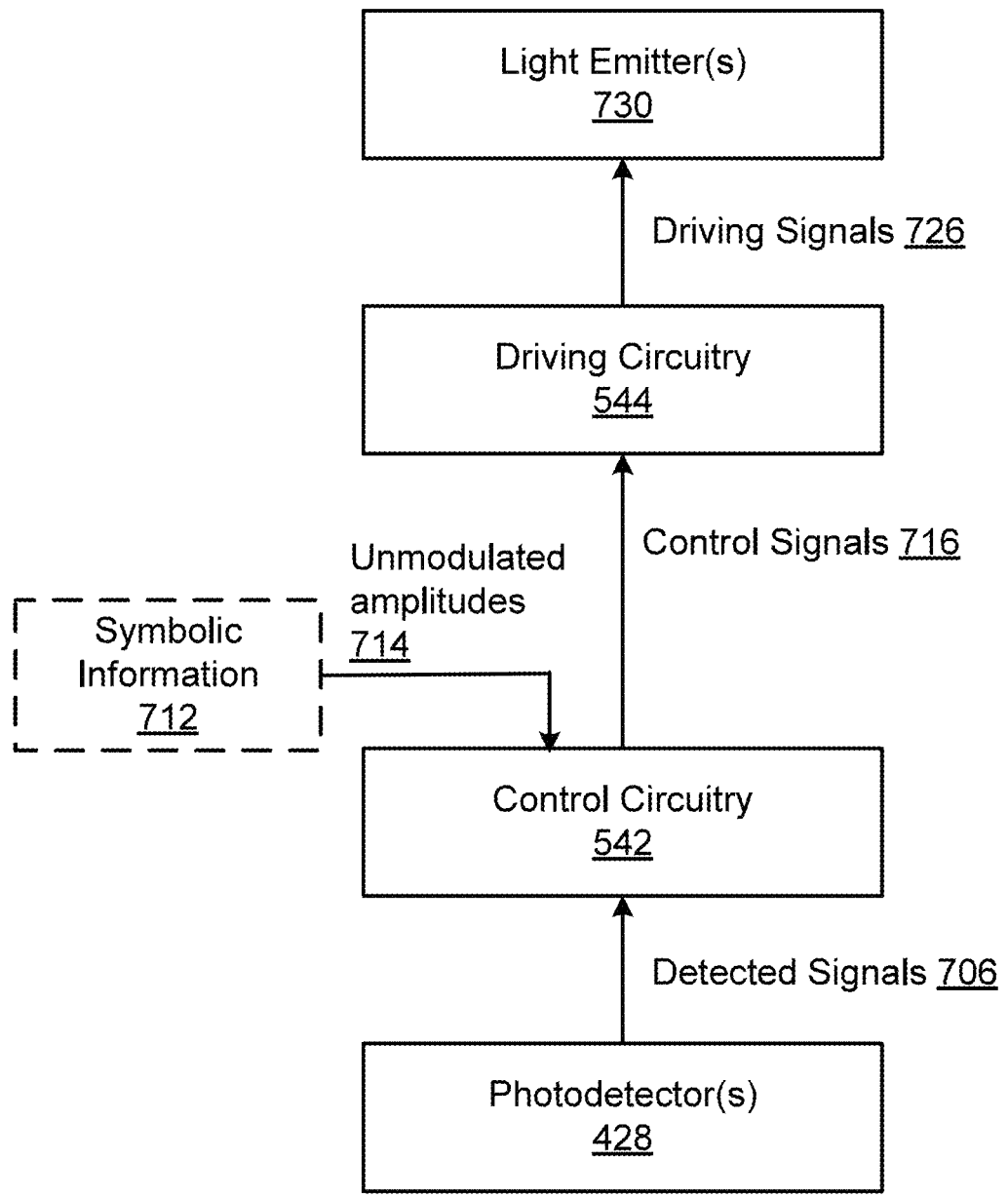
FIG. 7 illustrates a schematic diagram of the flow of signals from photodetectors to the display light(s), according to one embodiment.

FIG. 7 illustrates a schematic diagram of the photodetectors 428 and the light emitters 730 (e.g., the OLEDs). The photodetectors 428 receive the intensified light 216 and generate detected signals 706 therefrom. The detected signals 706 from the photodetectors 428 are received by the control circuitry 542. The control circuitry 542 may be located with the photodetectors 428 on a semiconductor chip, or may be externally located, such that a readout on the semiconductor chip communicates the detected signals 706 to the control circuitry 542.

Figure 8A:
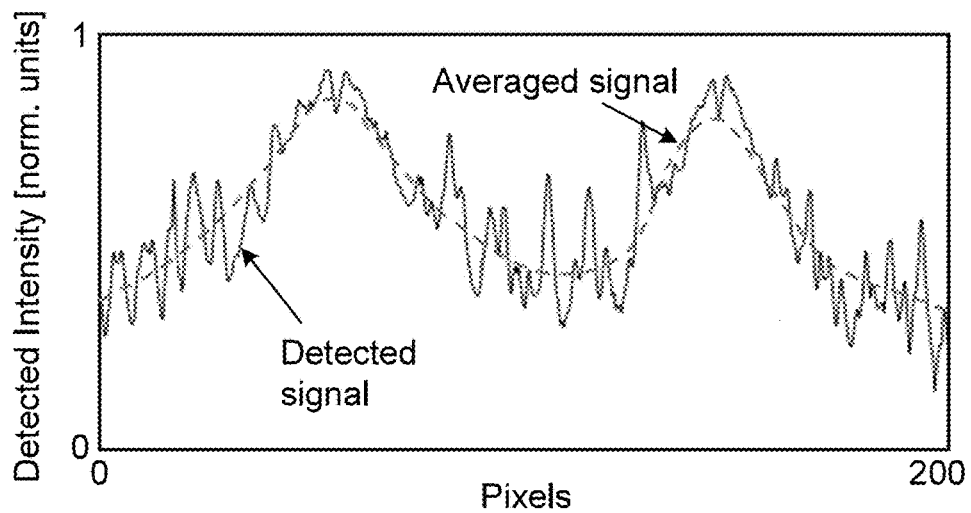
FIG. 8A illustrates a plot of detected intensity versus pixel indices, according to one embodiment.
Figure 8B:
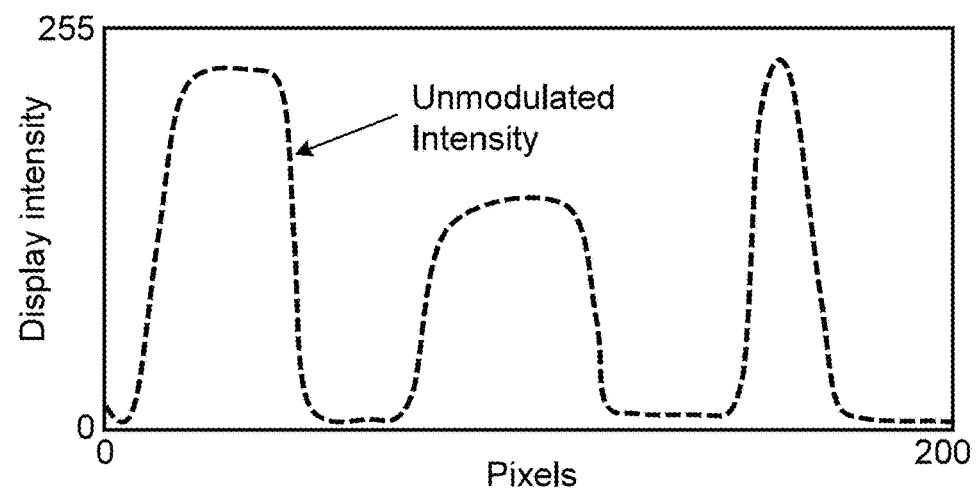
FIG. 8B illustrates a plot of display intensity versus pixel indices, according to one embodiment.
Figure 8C:
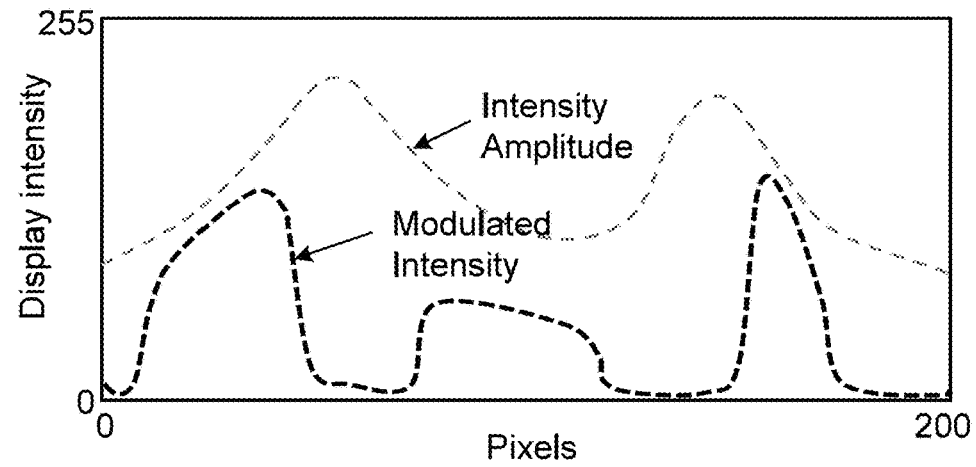
FIG. 8C illustrates a plot of modulated display intensity versus pixel indices, according to one embodiment.

The control circuitry 542 then process the detected signals 706 to generate control signals 716. This processing can include spatial averaging. For example, FIG. 8A illustrates a detected signal 706 that is averaged to generate an averaged signal, and is discussed below. In the case that the display light 220 performs the function of a heads-up display, the control circuitry 542 optionally receives unmodulated amplitudes 714 (e.g., the unmodulated amplitudes may represent symbolic information 712 such as text, pictograms, or other meaningful symbols). For example, the heads-up display can be used to communicate a text message, icons, pictograms, or other symbolic information. FIG. 8B illustrates an example, of an unmodulated intensity of a one-dimensional lineout/cross-section for the display light intensity representing text or pictograms, for example. The control circuitry 542 may process the unmodulated intensity using an intensity amplitude, which is based on the averaged, detected signal to generate a modulated intensity for the display pixels, as illustrated in FIG. 8C., and this modulated intensity then determines control signals 716. Because the display intensity is often nonlinearly related to the driving voltage/current to the light emitters 730, a non-linear relation may be used to map the modulated intensities to the control signals 716.

In the non-limiting example illustrated in FIG. 7, the driving circuitry 544 receives the control signals 716 and generates driving signals 726, which drive the light emitters 730 to generate the display light 220.

FIGS. 8A-8C illustrate an example of determining an intensity of the displayed light 220 based on the signals detected by the photodetectors 428. FIG. 8A illustrates a plot of the detected intensity of the intensified light 216 with respect to the pixels. The pixels are indexed from 0 to 200, and the detected intensity is normalized to a maximum value of 1. The detected intensity is illustrated as a solid black line, and the spatially averaged intensity is illustrated as a dashed grey line. FIG. 8B illustrates a plot of the unmodulated intensity of the displayed light 220 with respect to the pixels. The unmodulated intensity is the intensity of the display light 220 that would be generated if there were no photodetectors 428 or signals representing the intensity of the intensified image, for example. The intensity of the displayed light 220 is illustrated without scaling (e.g., the intensity of the displayed light 220 is allowed to span the entire range from the minimum value of 0 to the maximum value of 255). FIG. 8C illustrates a plot of the intensity amplitude (grey dashed line) with respect to the pixels. The intensity amplitude is based on the spatially averaged intensity illustrated in FIG. 8A. FIG. 8C illustrates a plot of scaled display intensity (black dashed line) with respect to the pixels. The scaled display intensity is determined using the intensity amplitude to scale the intensity of the displayed light 220 is illustrated in FIG. 8B. This example illustrated in FIGS. 8A-8C of scaling/modulating the displayed light intensity based on the signals detected by the photodetectors 428 is a non-limiting example.

The amount of scaling may be determined to preserve an intensity ratio between the display light 220 and the intensified light 216. The intensity ratio may be a ratio between an intensity of the display light 220 and an intensity of the intensified light 216. For example, the intensity ratio between the display light 220 and the intensified light 216 may be based on the intensity amplitude of the display light 220 (e.g., a in the above example) and the average detected intensity of the intensified light 216 over a predetermined region or zone of the overlay display 218. The intensity amplitude of the display light 220 may be determined using a monotonic function of the signal(s) detected by the photodetectors 428. The intensity amplitude of the display light 220 may be determined using a discrete function of the signal(s) detected by the photodetectors 428. The intensity amplitude of the display light 220 may be determined using a lookup table relating the signal(s) detected by the photodetectors 428 to respective values of the intensity amplitude of the display light 220. The intensity amplitude of the display light 220 may have a maximum value and a minimum value. As illustrated in the above example for 8-bit intensity values, the maximum value of the intensity amplitude a may be 255. Additionally, there may be a minimum value for the intensity amplitude/envelope a below which the information of the display light is too dim to accurately decipher by a user. Accordingly, the intensity amplitude a may be prevented from going below this minimum value for the intensity amplitude/envelope, even when the signal(s) detected by the photodetectors 428 become very small.

The areas of the overlay display may be organized, partitioned, classified, or assigned to respective zones relating to the anatomy of the eye. For example, there may be zones corresponding to peripheral vision. Additionally, the zones may correspond to different densities of rods and/or cones along the retina. The zones may correspond to the fovea, parafovea, perifovea, and macula, for example. The significance of maintaining the intensity ratio between the intensified and display light may be greater for zones corresponding to a higher density of rods, for example. The zones corresponding to a higher density of rods may be smaller than other zones or may have a narrower width for spatial averaging. The zones corresponding to peripheral vision may use a wider spatial average. Relative to other zones, the zones corresponding to a higher density of rods may enforce tighter controls on the intensity ratio between the intensified and display light, for example. A narrower width of the windowing function for spatial averaging of the signal(s) detected by the photodetectors 428 may be used for zones corresponding to a higher density of rods, for example.

In the examples above it should be noted that although not shown various alternatives can be implemented. For example, in any of the embodiments illustrated, a backside fill may be used or may be omitted. Alternatively, or additionally, while the active areas have been shown as being substantially square in nature, it should be appreciated that the active areas may be rectangular or other appropriate shapes.

The discussion above refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical device comprising:
 a semiconductor chip having a first surface that receives incident light, which passes through transparent regions of the optical device,
 a plurality of electro-optical circuits formed on the semiconductor chip, the plurality of electro-optical circuits including:
  light emitters configured to output display light, and the transparent regions being arranged among the light emitters; and
  detectors, each detector of the detectors being associated with one or more light emitters of the light emitters, and the detectors being configured to detect respective signals representing an intensity of the incident light, wherein
 an intensity of the display light output by the one or more light emitters depends on the signal detected by the associated detector, and wherein the intensity of the display light output by the one or more light emitters augments the incident light to amplify or correct the incident light, based on the signal detected by the associated detector.

2. The optical device of claim 1, wherein the intensity of the display light output by the one or more light emitters is determined using an amplitude of the intensity of the display light, the amplitude of the intensity being set for the one or more light emitters based on the signal detected by the associated detector.

3. The optical device of claim 1, wherein the intensity of the display light output by the one or more light emitters augments the incident light based on the signal detected by the associated detector.

4. The optical device of claim 3, wherein the display light output by the light emitters augments the incident light by setting the intensity of the display light output to compensate for (i) loss of the incident light and/or (ii) variations in a transmission efficiency of the incident light, wherein
 the loss of the incident light includes attenuation of the incident light due to propagation through the optical device and/or propagation through a incident imaging system that generates the incident light, and
 the variations in transmission efficiency of the incident light includes variations of the attenuation of the incident light due to propagation through the optical device and/or propagation through the incident imaging system.

5. The optical device of claim 1, wherein the plurality of electro-optical circuits is further configured to maintain one or more intensity ratios between the incident light and the display light by determining the intensity of the display light output by the respective light emitters based on the signals detected by the associated detectors.

6. The optical device of claim 1, wherein the plurality of electro-optical circuits is further configured to maintain one or more local intensity ratios between an amplitude of the incident light and an average of signals of the incident light at respective locations along the semiconductor chip.

7. The optical device of claim 1, wherein the intensity of the display light output by the one or more light emitters is determined using a combination of the signal of the associated detector and the signals of a predetermined quantity of neighboring detectors that are in a neighborhood of the associated detector.

8. The optical device of claim 1, wherein a combination of the signal of the associated detector and the signals of a predetermined quantity of neighboring detectors is a weighted sum of the associated detector and the signals of the predetermined quantity of neighboring detectors.

9. The optical device of claim 1, wherein the light emitters are assigned respective zones, and, for each of the zones, the plurality of electro-optical circuits is further configured to maintain, in a zone, a local intensity ratio between the incident light and the display light based on the signals detected by the detectors of the zone.

10. The optical device of claim 9, wherein parameters of the respective zones are based on an anatomy of an eye.

11. The optical device of claim 10, wherein
the parameters of the respective zones include an area for each of the respective zones, and
the areas of the zones depend on a density of rods and/or cones within parts of a retina of the eye corresponding to the respective zones or
the areas of zones depend on a distance between the respective zones and a location on the semiconductor chip corresponding to a center of a field of view of the eye.

12. The optical device of claim 3, wherein the display light augments the incident light by amplifying an image detected by the detectors.

13. The optical device of claim 1, wherein an amplitude of the intensity of the display light output by the one or more light emitters is scaled according to a scaling factor determined using the signal detected by the associated detector.

14. The optical device of claim 1, wherein the plurality of electro-optical circuits further includes control circuitry configured to control the intensity of the display light output by the one or more light emitters based on the signal detected by the associated detector.

15. The optical device of claim 14, wherein the control circuitry is formed on the semiconductor chip.

16. The optical device of claim 1, further comprising:
an intensifier that generates the incident light, the intensifier comprising:
a photocathode configured to receive imaged light from an objective and emit electrons in response to the imaged light;
a multiplier configured to receive electrons emitted from the photocathode and to increase a number of the electrons, generating multiplied electrons; and
a phosphor screen that receives the multiplied electrons and in response to incident emits the direct view light, the direct view light representing an intensified image.

17. The optical device of claim 1, wherein the incident light has a first color, and the light emitters output the display light that has a second color that is different from the first color.

18. The optical device of claim 1, wherein, for a range of values of the signal detected by the associated detector, the intensity of the display light increases when the signal detected by the associated detector increases, and the intensity of the display light decreases when the signal detected by the associated detector decreases.

19. A method of balancing an intensity of display light relative to an intensity of incident light in an optical device, the method comprising:
receiving incident light at a first surface of a semiconductor chip in an optical device, the semiconductor chip having transparent regions through which the incident light is transmitted, and the semiconductor chip having a plurality of electro-optical circuits that include light emitters and detectors, each detector of the detectors being associated with one or more of the light emitters;
detecting, by the detectors, a signal representing an intensity of the incident light; and
outputting display light from the light emitters, an intensity of the display light output by the one or more light emitters being determined using the signal detected by the associated detector, and wherein the intensity of the display light output by the one or more light emitters augments the incident light to amplify or correct the incident light, based on the signal detected by the associated detector.

20. The method of claim 19, further comprising determining the display light output by the one or more light emitters by setting an amplitude of the intensity of the display light output by the one or more light emitters based on the signal detected by the associated detector.

* * * * *